(12) United States Patent
Akada et al.

(10) Patent No.: US 12,132,013 B2
(45) Date of Patent: Oct. 29, 2024

(54) SEMICONDUCTOR DEVICE

(71) Applicant: KIOXIA CORPORATION, Tokyo (JP)

(72) Inventors: Yusuke Akada, Yokohama (JP); Rina Kadowaki, Koza Kanagawa (JP); Hiroyuki Maeda, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/171,954

(22) Filed: Feb. 21, 2023

(65) Prior Publication Data
US 2023/0197641 A1  Jun. 22, 2023

Related U.S. Application Data

(63) Continuation of application No. 17/513,212, filed on Oct. 28, 2021, now Pat. No. 11,610,852, which is a continuation of application No. 16/791,798, filed on Feb. 14, 2020, now Pat. No. 11,183,469, which is a continuation-in-part of application No. 16/254,646, filed on Jan. 23, 2019, now abandoned.

(30) Foreign Application Priority Data

Aug. 29, 2018 (JP) .................. 2018-160575
Nov. 21, 2018 (JP) .................. 2018-218600

(51) Int. Cl.
*H01L 23/58* (2006.01)
*H01L 21/82* (2006.01)
*H01L 23/31* (2006.01)

(52) U.S. Cl.
CPC ............ *H01L 23/585* (2013.01); *H01L 21/82* (2013.01); *H01L 23/3171* (2013.01)

(58) Field of Classification Search
None
See application file for complete search history.

(56) References Cited

U.S. PATENT DOCUMENTS

| 5,789,302 A | 8/1998 | Mitwalsky et al. |
| 6,492,247 B1 | 12/2002 | Guthrie et al. |
| 8,970,008 B2 | 3/2015 | Gratz et al. |
| 2005/0026397 A1* | 2/2005 | Daubenspeck ......... H01L 21/78 257/E21.309 |

(Continued)

FOREIGN PATENT DOCUMENTS

| JP | 10-270388 | 10/1998 |
| JP | 2013-55183 A | 3/2013 |

*Primary Examiner* — Khaja Ahmad
(74) *Attorney, Agent, or Firm* — Oblon, McClelland, Maier & Neustadt, L.L.P.

(57) ABSTRACT

A semiconductor device according to the present embodiment includes a substrate having a first region provided with a semiconductor element and a second region provided from the first region to an end. A material film is provided above the first and second regions. A first metal film is provided on the material film in the second region or on the material film between the first region and the second region. A trench, which caves in toward the substrate from a surface of the material film in the first region and from a surface of the material film under the first metal film, is provided in the material film between the first metal film and the first region.

20 Claims, 12 Drawing Sheets

(56) References Cited

U.S. PATENT DOCUMENTS

| | | | |
|---|---|---|---|
| 2006/0001104 A1* | 1/2006 | Ookura | H01L 23/53295 |
| | | | 438/296 |
| 2009/0160050 A1* | 6/2009 | Miyakawa | H01L 25/117 |
| | | | 257/737 |
| 2009/0243044 A1 | 10/2009 | Tanaka | |
| 2010/0007024 A1* | 1/2010 | Uchikoshi | H01L 24/05 |
| | | | 257/737 |
| 2010/0244199 A1* | 9/2010 | Sakuma | H01L 21/76802 |
| | | | 257/618 |
| 2012/0199984 A1 | 8/2012 | Fujita | |
| 2015/0060967 A1 | 3/2015 | Yokoyama | |
| 2016/0111381 A1* | 4/2016 | Werner | H01L 21/02118 |
| | | | 438/618 |
| 2016/0268166 A1* | 9/2016 | Nakajima | H10B 43/10 |
| 2017/0179152 A1* | 6/2017 | Toyama | H01L 21/76802 |
| 2018/0151470 A1 | 5/2018 | Cook | |

\* cited by examiner

SEMICONDUCTOR DEVICE

CROSS REFERENCE TO RELATED APPLICATIONS

This application is a continuation of and claims benefit under 35 U.S.C. § 120 to U.S. application Ser. No. 17/513,212 filed Oct. 28, 2021, which is a continuation of and claims benefit under 35 U.S.C. § 120 to U.S. application Ser. No. 16/791,798 filed Feb. 14, 2020, (now U.S. Pat. No. 11,183,469), which is a continuation-in-part of and claims benefit under 35 U.S.C. § 120 to U.S. application Ser. No. 16/254,646 filed Jan. 23, 2019, which is based upon and claims the benefit of priority under 35 U.S.C. § 119 from Japanese Patent Application No. 2018-160575, filed on Aug. 29, 2018 and Patent Application No. 2018-218600, filed on Nov. 21, 2018, the entire contents of each of which are incorporated herein by reference.

FIELD

The embodiments of the present invention relate to a semiconductor device.

BACKGROUND

When a semiconductor wafer is chipped by dicing into semiconductor chips or after being chipped, a material film may be peeled off from a substrate in a dicing region at an end of a semiconductor chip. Such peeling-off of the material film causes a failure in the semiconductor chip when the peeling-off propagates from the dicing region to a device region.

DETAILED DESCRIPTION

Figure 1:
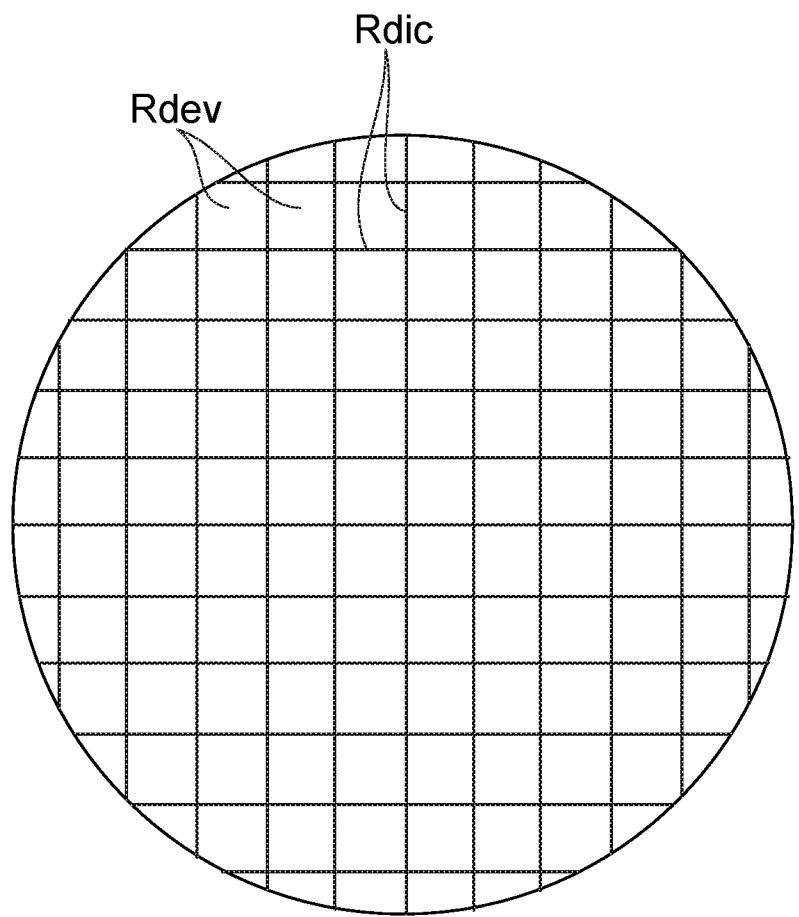
FIG. 1 is a schematic plan view showing an example of a semiconductor wafer in accordance with a first embodiment.

Embodiments will now be explained with reference to the accompanying drawings. The present invention is not limited to the embodiments. In the embodiments, "an upper direction" or "a lower direction" refers to a relative direction when a direction of a surface perpendicular to a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a substrate having a first region provided with a semiconductor element and a second region provided from the first region to an end. A material film is provided above the first and second regions. A first metal film is provided on the material film in the second region or on the material film between the first region and the second region. A trench, which caves in toward the substrate from a surface of the material film in the first region and from a surface of the material film under the first metal film, is provided in the material film between the first metal film and the first region.

First Embodiment

FIG. 1 is a schematic plan view showing an example of a semiconductor wafer in accordance with a first embodiment. A semiconductor wafer W is provided with a plurality of device regions Rdev and a plurality of dicing regions Rdic. The device regions Rdev and the dicing regions Rdic are regions on the front surface of the semiconductor wafer W.

In each device region Rdev as a first region, a semiconductor element (not shown), such as a transistor and a memory cell array, is provided. The semiconductor element is formed on the semiconductor wafer W through a semiconductor manufacturing process. The semiconductor element may, for example, be a memory cell array of NAND flash memories or its control circuit. The memory cell array may, for example, be a three-dimensional memory cell array of three-dimensionally arranged memory cells. It is a matter of course that the present embodiment is also applicable to LSI (Large Scale Integration) other than the semiconductor memories.

Each dicing region Rdic, as a second region, is a line-like region between device regions Rdev adjacent to each other, which is a region to be cut by dicing. The dicing region Rdic is also referred to as a dicing line. According to the present embodiment, a laser beam is emitted to a substrate 10 to form a modified portion LM (see FIG. 4) inside the substrate 10 in the dicing region Rdic, and then the semiconductor wafer W is cleaved at the modified portion LM as a starting point. In this way, the semiconductor wafer W is chipped per device region Rdev into semiconductor chips. Silicon is an example of semiconductor, however, another semiconductor, other than silicon, may also be used.

A dicing method for the semiconductor wafer W will be explained next. In the present embodiment, the semiconductor wafer W is cut with a laser dicing method using a laser beam. As for the laser beam, for example, a through-transmission laser in the infrared region is used. Instead of the laser dicing method, another dicing method, such as a blade dicing method, may be used.

FIGS. 2 to 8 are illustrations showing an example of the dicing method according to the first embodiment. Semiconductor elements formed on the semiconductor wafer W are omitted in the illustrations. A material film 20 formed above the substrate 10 and the semiconductor elements is schematically illustrated. The configuration of the material film 20 will be explained later with reference to FIG. 10.

Figure 2:
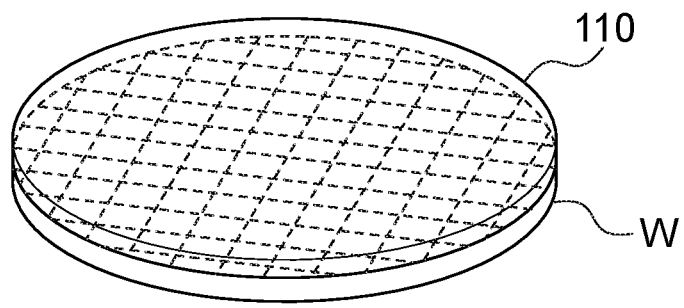
FIG. 2 is an illustration showing an example of a dicing method according to the first embodiment.

At first, as shown in FIG. 2, a protective tape 110 for dicing is stuck on the front surface of the semiconductor wafer W. The protective tape 110 protects the semiconductor elements, the material film 20, etc. at the time of laser dicing.

Figure 3:
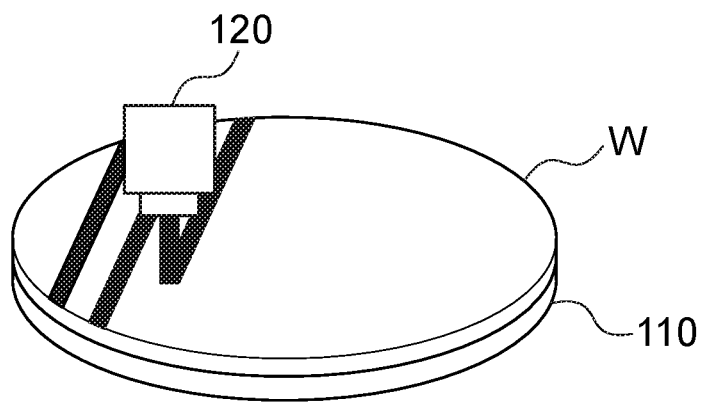
FIG. 3 is an illustration showing the example of the dicing method, following to FIG. 2.
Figure 4:
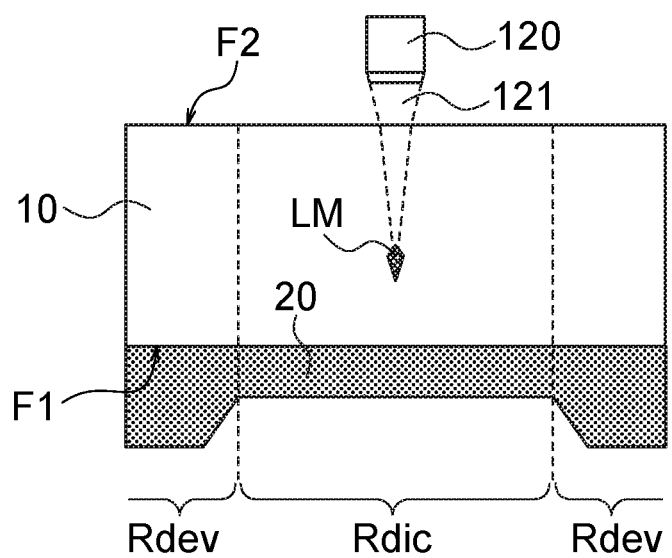
FIG. 4 is an illustration showing the example of the dicing method, following to FIG. 2.

Subsequently, the semiconductor wafer W and the protective tape 110 are turned upside down, and, as shown in FIGS. 3 and 4, using a laser oscillator 120, a laser beam 121 is emitted to the portions which correspond to the dicing regions Rdic from the rear surface of the semiconductor wafer W. In this way, as shown in FIG. 4, a modified portion (amorphous layer or polysilicon layer) LM is formed inside the semiconductor wafer W. The modified portion LM is formed inside the semiconductor wafer W in each dicing region Rdic.

Figure 5:
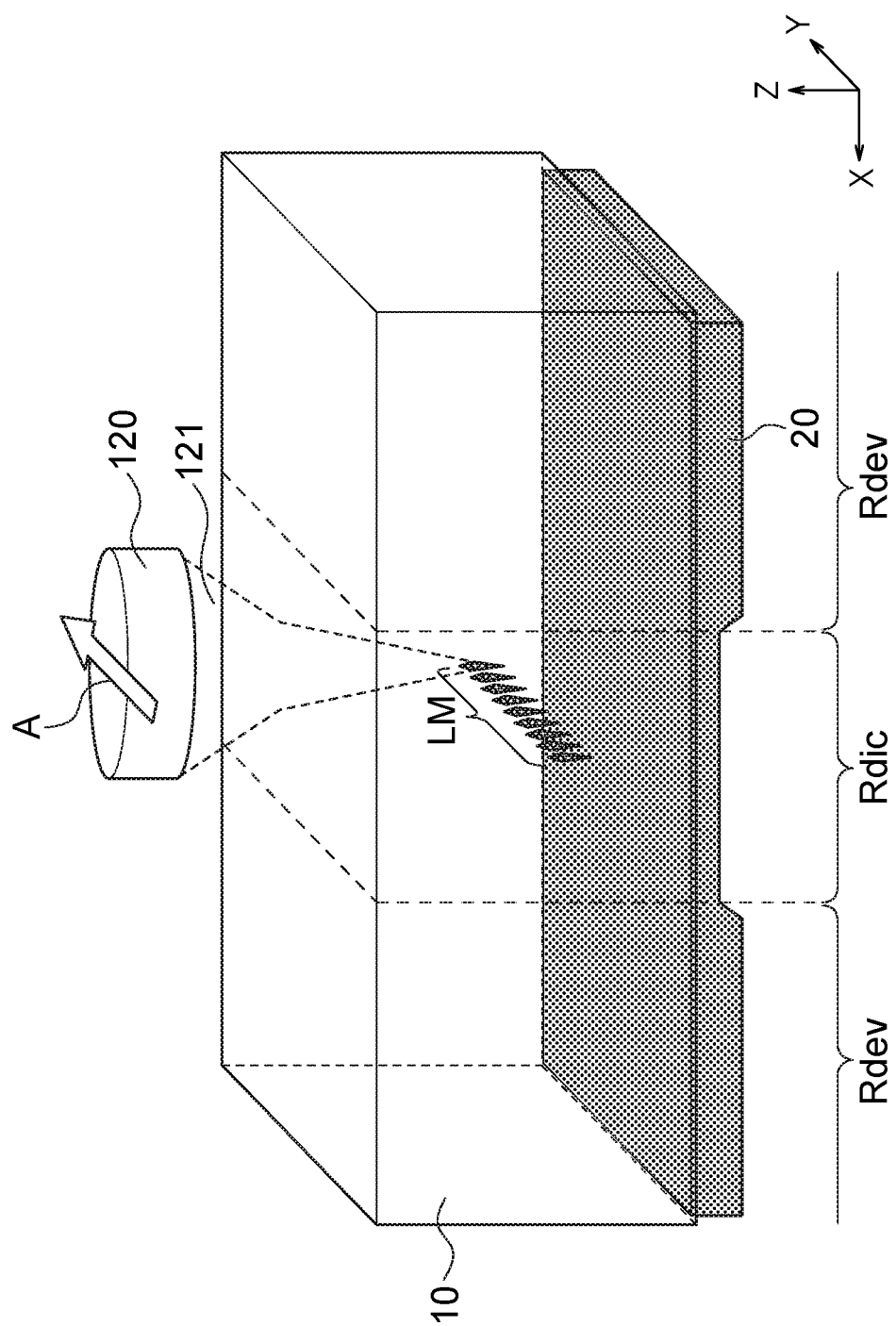
FIG. 5 is an illustration showing the example of the dicing method, following to FIG. 2.

FIG. 5 is a perspective view showing the state of emitting the laser beam 121. The laser oscillator 120, while moving in a Y-direction as shown by an arrow A, emits the laser beam 121 in the form of pulses. In this way, modified portions LM are formed intermittently in the Y-direction and formed roughly in parallel along the dicing region Rdic. Although being formed intermittently, the modified portions LM are connected in the Y-direction roughly in the form of a layer. The modified portions LM may be in the form of a single layer or a plurality of layers formed at different positions (heights) in a Z-direction.

Figure 6:
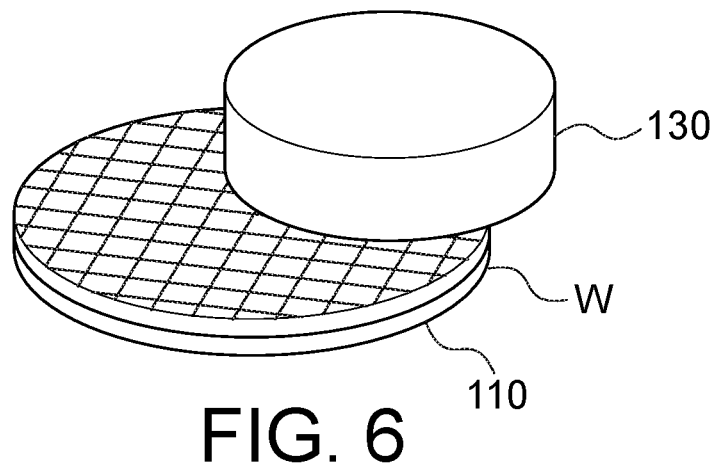
FIG. 6 is an illustration showing the example of the dicing method, following to FIG. 3.
Figure 7:
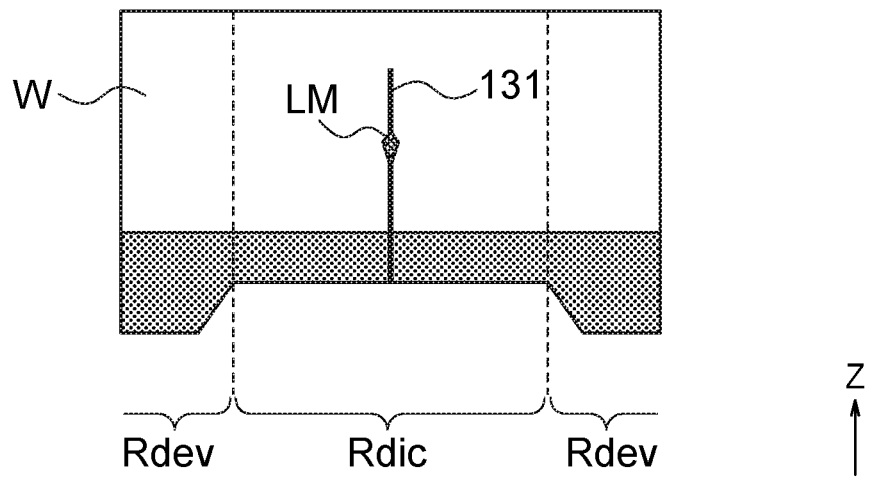
FIG. 7 is an illustration showing the example of the dicing method, following to FIG. 3.

Subsequently, as shown in FIG. 6, the rear surface of the semiconductor wafer W is polished by CMP (Chemical Mechanical Polishing). Being polished with a sharpening stone 130, the semiconductor wafer W is thinned, and not only that, as shown in FIG. 7, a cleavage 131 spreads in the Z-direction from each modified portion LM due to vibration by polishing. The semiconductor wafer W is polished until the modified portions LM are removed.

Figure 8:
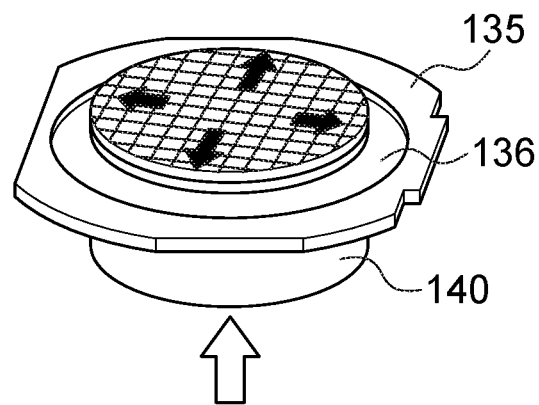
FIG. 8 is an illustration showing the example of the dicing method, following to FIG. 6.

Subsequently, the rear surface of the semiconductor wafer W is stuck on a dicing tape 136 having an adhesive layer and then the dicing tape 136 is fixed with a ring 135. Subsequently, as shown in FIG. 8, the dicing tape 136 is pushed up with a push-up member 140 to be pulled (expanded). In this way, together with the dicing tape 136, the semiconductor wafer W is pulled outwardly. At this time, the semiconductor wafer W is cleaved further along the modified portions LM, which are the starting points, (in other words, along the dicing lines), to be chipped into a plurality of semiconductor chips.

Figure 10:
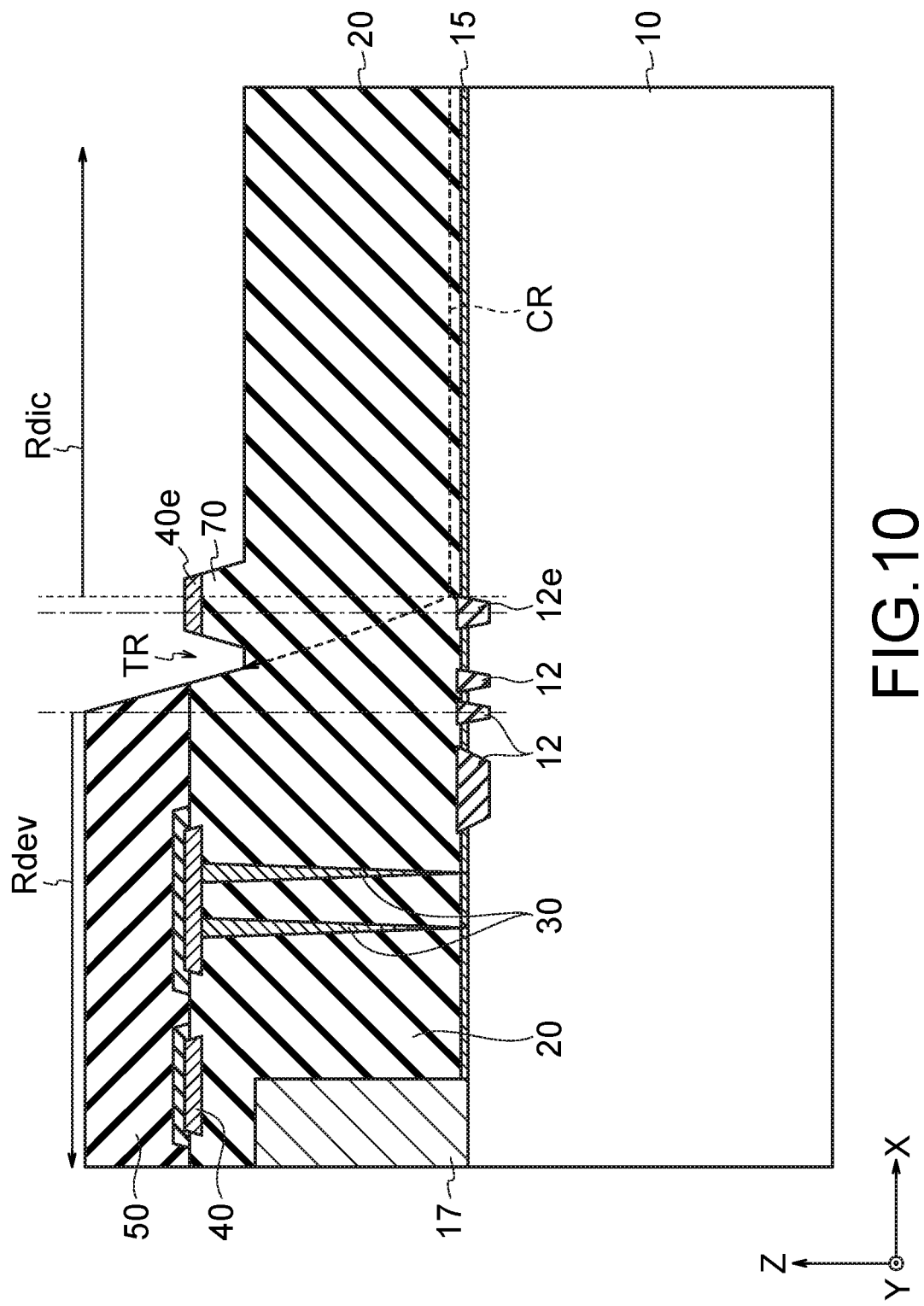
FIG. 10 is a sectional view taken on line 10-10 of FIG. 9.

In the above example, the rear surface of the semiconductor wafer W is polished after being irradiated with a laser beam. However, the semiconductor wafer W may be irradiated with the laser beam after being polished at its rear surface. Moreover, in the present embodiment, although the laser dicing method is explained, another dicing method, such as a blade dicing method, may be used. The blade dicing method vibrates the semiconductor wafer W much more than the laser dicing method, to cut the material film 20, the substrate 10, etc. directly with a blade, so that a crack CR shown in FIG. 10 is easily generated. Therefore, the effects of the present embodiment will be exhibited further by applying the present embodiment to the blade dicing method.

Thereafter, each semiconductor chip is picked up and mounted on a resin substrate (not shown). The semiconductor chip is bonded to the resin substrate by metal wiring and sealed with resin, thereby a semiconductor package is completed.

Figure 9:
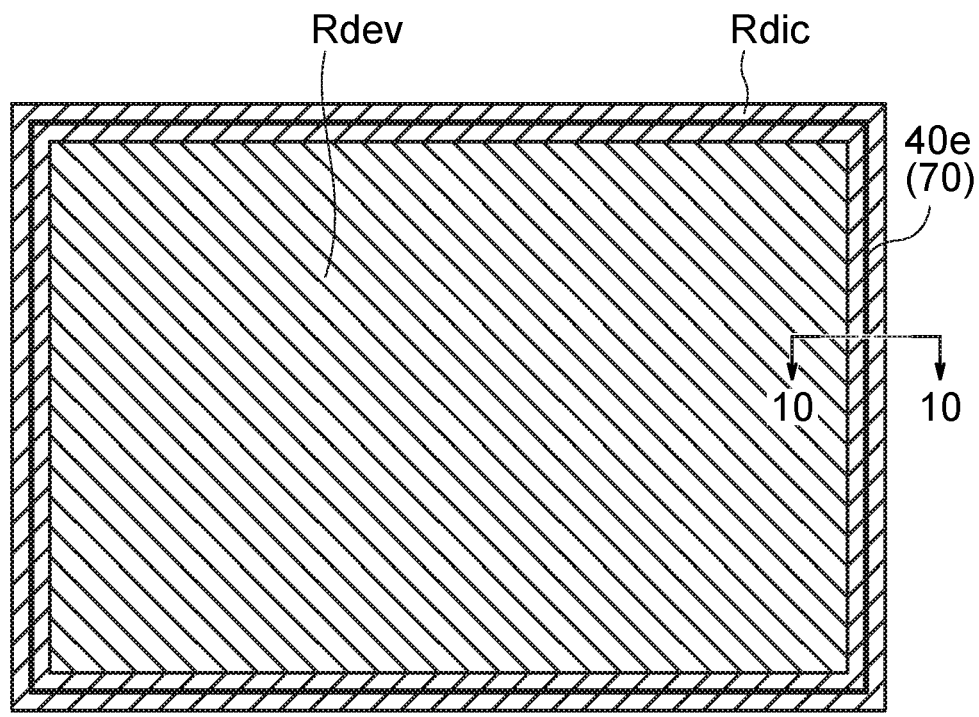
FIG. 9 is a schematic plan view showing a configuration example of one semiconductor chip after diced.

FIG. 9 is a schematic plan view showing a configuration example of one semiconductor chip 1 after diced. The semiconductor chip 1 has a device region Rdev and a dicing region Rdic on its front surface. The device region Rdev, as a first region, is a region in which a semiconductor element is provided, on the front surface of the substrate 10 (see FIG. 10). The dicing region Rdic is a region from the device region Rdev to an end of the substrate 10, on the front surface of the substrate 10, which is a region to be used for cutting in a dicing process. The dicing region Rdic is provided with a first metal film 40e and a protruding portion 70. The first metal film 40e and the protruding portion 70 are arranged at a position apart from the device region Rdev so as to surround the device region Rdev. The first metal film 40e and the protruding portion 70 will be explained later in detail with reference to FIG. 10. The dicing region Rdic, the first metal film 40e, and the protruding portion 70 may be completely removed in the dicing process, however, in general, at least partially remain in the periphery of the device region Rdev as shown in FIG. 9.

FIG. 10 is a sectional view taken on line 10-10 of FIG. 9. The semiconductor chip 1, as a semiconductor device, is provided with a substrate 10, element isolation portions 12, a metal compound layer 15, a semiconductor element 17, a material film 20, crack stoppers 30, metal films 40, and a passivation film 50.

The substrate 10 is, as described above, a semiconductor substrate such as a silicon substrate. The semiconductor element 17 provided in the device region Rdev of the substrate 10 may, for example, be a memory cell array or a CMOS circuit.

The metal compound layer 15 is provided on the substrate 10, used for a gate electrode (not shown) of a transistor in the device region Rdev. As for the metal compound layer 15, a conductive metal compound, such as tungsten silicide (WSi) or tungsten nitride (WN), is used. Although remaining in the dicing region Rdic, the metal compound layer 15 is not provided as a component of the semiconductor element 17. In the dicing region Rdic, the metal compound layer 15 is provided for maintaining the flatness of the front surface of the substrate 10 and for easy positioning in a lithography process.

The element isolation portions 12 define active areas in the device region Rdev, provided for electrically isolating the active areas from each other. The element isolation portions 12 are also referred to as STI (Shallow Trench Isolation). The element isolation portions 12 are also provided between the device region Rdev and the dicing region Rdic. For example, among the element isolation portions 12, an element isolation portion 12e nearest to the perimeter of the semiconductor chip 1 is provided between the device region Rdev and the dicing region Rdic and provided so as to divide the metal compound layer 15. Although being provided between the device region Rdev and the dicing region Rdic, the element isolation portion 12e may be provided in the dicing region Rdic. Moreover, in the planar layout, the element isolation portion 12e is provided so as to surround the entire periphery of the device region Rdev along the perimeter of the semiconductor chip 1 of FIG. 9 (along the dicing region Rdic). The element isolation portion 12e has a function to restrict the propagation of a crack CR or change the direction of the crack CR when the crack CR is generated between the metal compound layer 15 and the material film 20. The element isolation portion 12e may also have a function to separate a test pattern present in the dicing region Rdic.

The material film 20 is provided on the device region Rdev and also on the dicing region Rdic. When the semiconductor element 17 is a memory cell array, the material film 20 in the dicing region Rdic is, for example, a stacked film (also referred to as an ONON film, hereinafter) of a plurality of silicon oxide films ($SiO_2$) and a plurality of silicon nitride films (SIN) alternately stacked, or a stacked film (also referred to as an OWOW film, hereinafter) of a plurality of silicon oxide films ($SiO_2$) and a plurality of second metal films (for example, tungsten films (W)) alternately stacked. The ONON film is a stacked film to be used in a memory cell array forming process. In the memory cell array forming process, the silicon nitride films of the ONON film are replaced with the second metal films (for example, tungsten films), so that the ONON film changes to be the OWOW film. The OWOW film is used as one component of the memory cell array. In this case, the second metal films function as word lines of the memory cell array. The material film 20 may either be the ONON film or the OWOW film.

When the semiconductor element 17 is a CMOS transistor of an LSI, the material film 20 in the dicing region Rdic may be an interlayer insulating film to cover the CMOS transistor. For example, the material film 20 in the dicing region Rdic may be a single-layer film of a silicon oxide film such as a TEOS film.

The crack stoppers 30 are provided inside the material film 20 on the perimeter of the device region Rdev and extend in the Z-direction toward the substrate 10 from the surface of the material film 20. The crack stoppers 30 have, for example, a metal such as tungsten embedded therein. The crack stoppers 30 are provided so as to surround the periphery of the device region Rdev. Accordingly, the crack stoppers 30 restrict the propagation of the crack CR into the device region Rdev. The crack stoppers 30 are also referred to as a guard ring.

The metal films 40 are, for example, used as a bonding-pad forming material. As for the metal films 40, a conductive metal such as tungsten is used. Among the metal films 40, the first metal film 40e nearest to the perimeter of the semiconductor chip 1 is provided on the material film 20 in the dicing region Rdic or on the material film 20 between the device region Rdev and the dicing region Rdic, provided at a position apart from the device region Rdev. The first metal film 40e functions as a mask in an etching process to expose bonding pads and is provided for forming a trench TR. In the etching process, the protruding portion 70 made of the material film 20 is formed under the first metal film 40e. In the same manner as the first metal film 40e, the protruding portion 70 is also disposed so as to surround the device region Rdev at a position apart from the device region Rdev. Accordingly, the trench TR is formed between the device region Rdev and the protruding portion 70.

The passivation film 50 covers the material film 20 in the device region Rdev and protects the semiconductor element 17, the material film 20, etc. The passivation film 50 is, for example, polyimide.

The trench TR is provided between the device region Rdev and the dicing region Rdic, and provided near to the device region Rdev than the element isolation portions 12. The trench TR caves in toward the substrate 10 from the surface of the material film 20 in the device region Rdev and also from the surface of the material film 20 under the first metal film 40e. In other words, the trench TR caves in to a position lower than the surface of the material film 20 around the trench TR. The material film 20 has been etched in the same manner as the trench TR in the dicing region Rdic outside the first metal film 40e. However, the material film 20 may not have been etched in the dicing region Rdic outside the first metal film 40e.

It is preferable for the trench TR to be provided to surround the entire periphery of the device region Rdev. However, the trench TR may be partially provided at a location where the material film 20 is easily peeled off and the crack CR is easily generated. Moreover, the trench TR may have a flat, curved or pointed bottom.

When the metal compound layer 15 is provided between the substrate 10 and the material film 20 in the dicing region Rdic, the material film 20 is easily peeled off from the metal compound layer 15 at an end of the semiconductor chip 1, due to an impact in the dicing process, stress in TCT (Thermal Cycle Test), etc. When the material film 20 is peeled off from the metal compound layer 15, the crack CR propagates between the material film 20 and the metal compound layer 15, toward the element isolation portion 12e. In other words, the crack CR propagates toward the device region Rdev from the end of the semiconductor chip 1.

Since the element isolation portion 12e divides the metal compound layer 15, the propagation of the crack CR may stop when it reaches the element isolation portion 12e. However, since the material film 20 is thinner than the substrate 10 and vulnerable to mechanical stress, when the crack CR propagates further, it propagates inside the material film 20. In other words, the crack CR tries to propagate toward the upper surface of the element isolation portion 12e (in the Z-direction apart from the substrate 10). Therefore, force directed toward the device region Rdev from the end of the semiconductor chip 1 and force directed upward (in the Z-direction) from the element isolation portion 12e are applied to the material film 20. Accordingly, the crack CR propagates inside the material film 20 diagonally upward from the element isolation portion 12e toward the device region Rdev.

The trench TR is provided on the surface of the material film 20 between the device region Rdev and the dicing region Rdic, and provided nearer to the device region Rdev than the element isolation portion 12e. Therefore, the trench TR is positioned above the element isolation portion 12e in a diagonally upward direction, so that the crack CR can easily propagate toward the trench TR and, when the crack CR reaches the trench TR, the propagation completes. Accordingly, the trench TR has a function to induce the crack CR and terminate the crack CR with no propagation to the device region Rdev.

In order for the trench TR to effectively induce the crack CR, the trench TR is preferably a cavity with no another material being embedded therein. Specifically, the trench TR is preferably a cavity from the moment of formation of the trench TR to the moment of installation of the semiconductor chip 1 (for example, in the dicing and TCT processes). It is not problematic that a thin film is attached to the inner surface of the trench TR. In the TCT process, the trench TR may be filled with sealing resin. In this case, although a crack induction effect of the trench TR is reduced a little bit, it is still effective.

Figure 11:
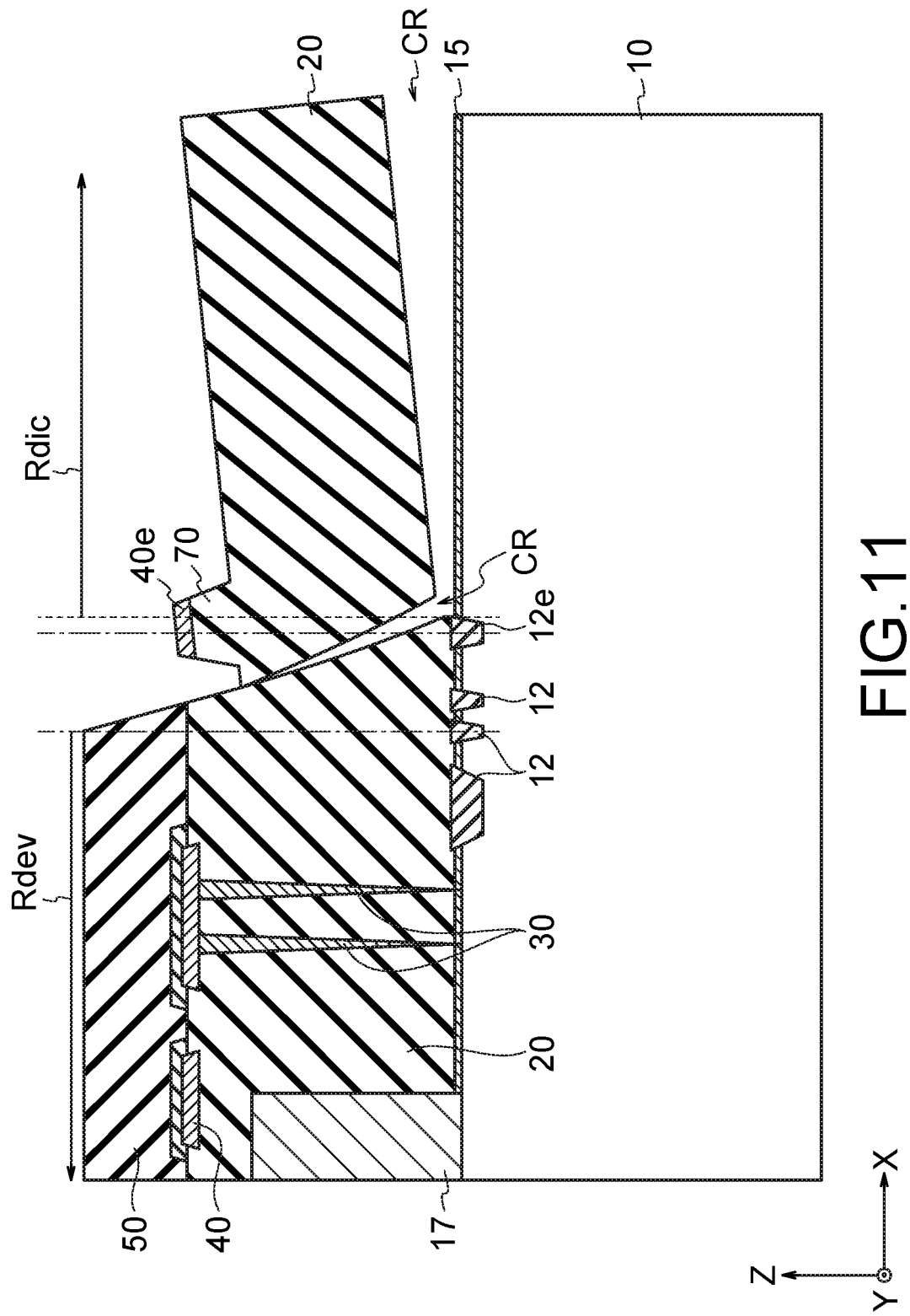
FIG. 11 is an illustration showing the state of propagation of a crack that has reached a trench.

FIG. 11 is an illustration showing the state of propagation of the crack CR that has reached the trench TR. When the crack CR has spread from the end of the semiconductor chip 1 and reached the element isolation portion 12e, the crack CR propagates in a diagonally upward direction toward the trench TR. When the crack CR has reached the trench TR, it does not propagate anymore. The material film 20 at the end of the semiconductor chip 1 may be brown off to be removed without remaining there. However, since the material film 20 is not required in the dicing region Rdic, there is no problem even if it is removed. Of course it is not problematic even if the material film 20 remains at the end of the semiconductor chip 1.

The position of the trench TR that easily induces the crack CR depends on the conditions such as the film thickness of the material film 20, and hence it cannot be said definitely. However, for example, in the case where the material film 20 is an ONON film having a film thickness of about 5 μm to 15 μm, it is preferable, in the planer layout viewed from above the front surface of the substrate 10, to provide the trench TR at a position near to the device region Rdev by about 5 μm from the element isolation portion 12e.

In order to dispose the trench TR nearer to the device region Rdev than the element isolation portion 12e, the first metal film 40e may be disposed directly above the element isolation portion 12e. In other words, in the planer layout viewed from above the front surface of the substrate 10, the first metal film 40e may be disposed at roughly the same position as the element isolation portion 12e. Accordingly, the trench TR is disposed nearer to the device region Rdev than the element isolation portion 12e in a self-alignment manner.

Figure 12:
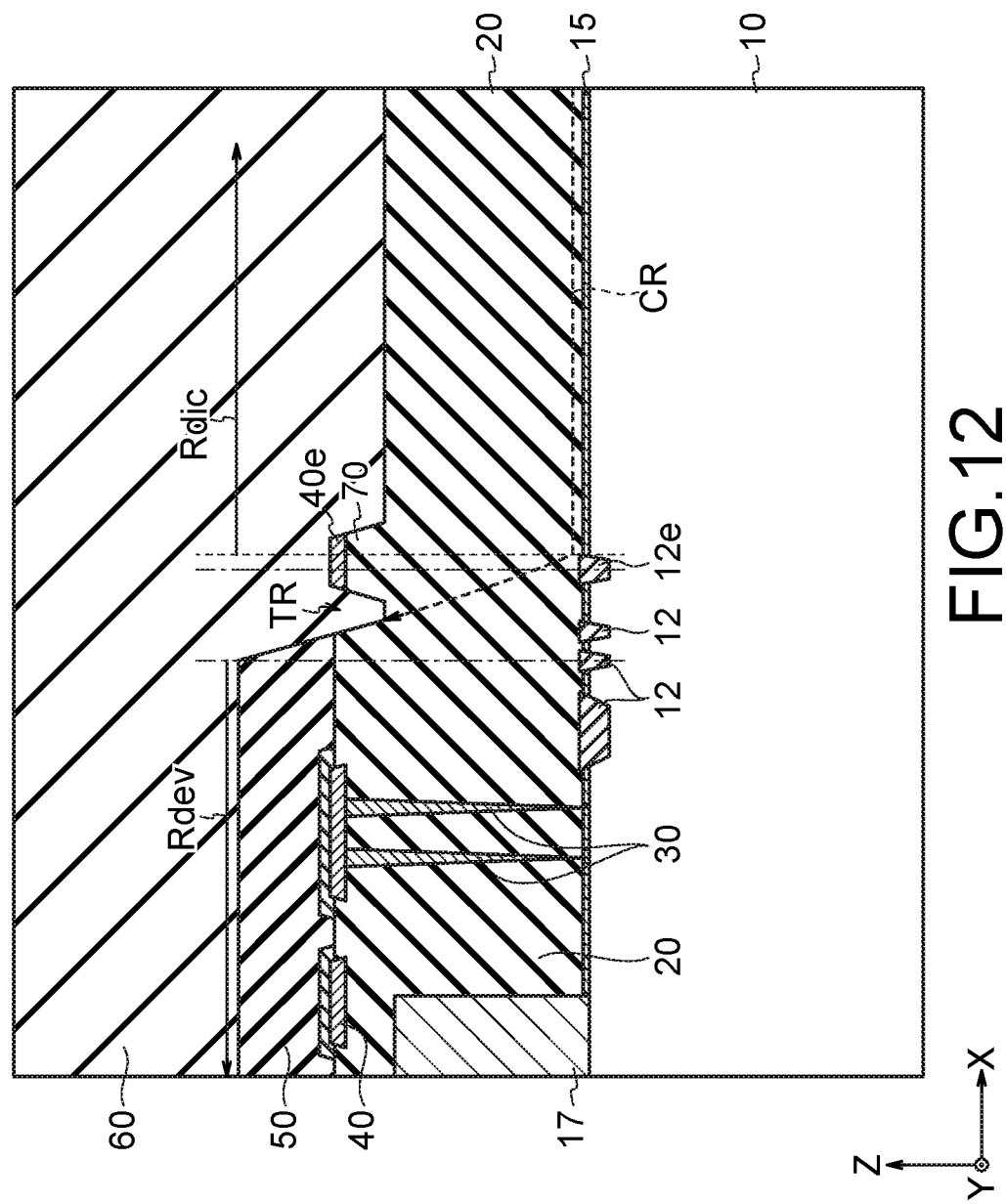
FIG. 12 is a sectional view showing the state of a semiconductor device after packaged.

FIG. 12 is a sectional view showing the state of a semiconductor device after packaged. After being diced, the semiconductor chip 1 is mounted on a substrate (not shown) and then sealed with resin 60 as a resin portion. The resin 60 is provided above both of the dicing region Rdic and the device region Rdev. Moreover, as shown in FIG. 12, in the case where the first metal film 40e and the protruding portion 70 are still present, the resin 60 covers the material film 20, the first metal film 40e, the protruding portion 70, and the passivation film 50, and has a contact with these components. The trench TR is filled with the resin 60.

(First Modification)

Figure 13:
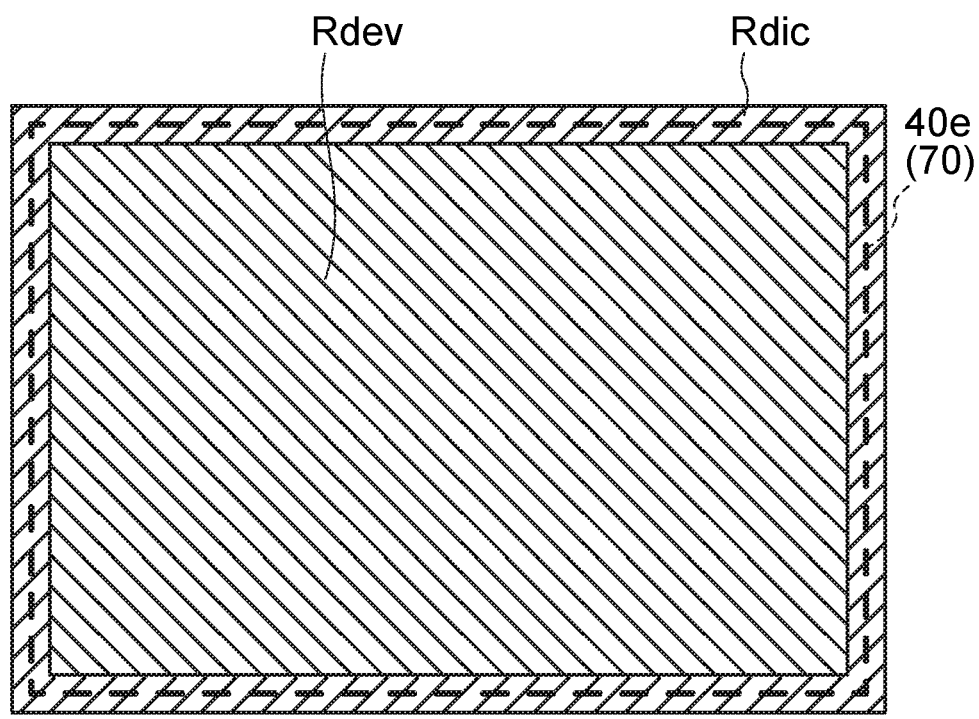
FIG. 13 is a schematic plan view showing another example of a configuration of one semiconductor chip after being diced.

FIG. 13 is a schematic plan view showing another example of the configuration of one semiconductor chip 1 after being diced. The dicing region Rdic is provided with the first metal film 40e and the protruding portion 70. The first metal film 40e and the protruding portion 70 are arranged at a position apart from the device region Rdev so as to surround the device region Rdev. In this example, however, the first metal film 40e and the protruding portion 70 are not continuous and are provided intermittently. In this way, the first metal film 40e and the protruding portion 70 do not always need to be provided continuously all around the device region Rdev and may be provided intermittently. Also in this case, the trench TR can induce the crack CR that is generated between the material film 20 and the metal compound layer 15 and terminate the propagation of the crack CR.

(Second Modification)

Figure 14:
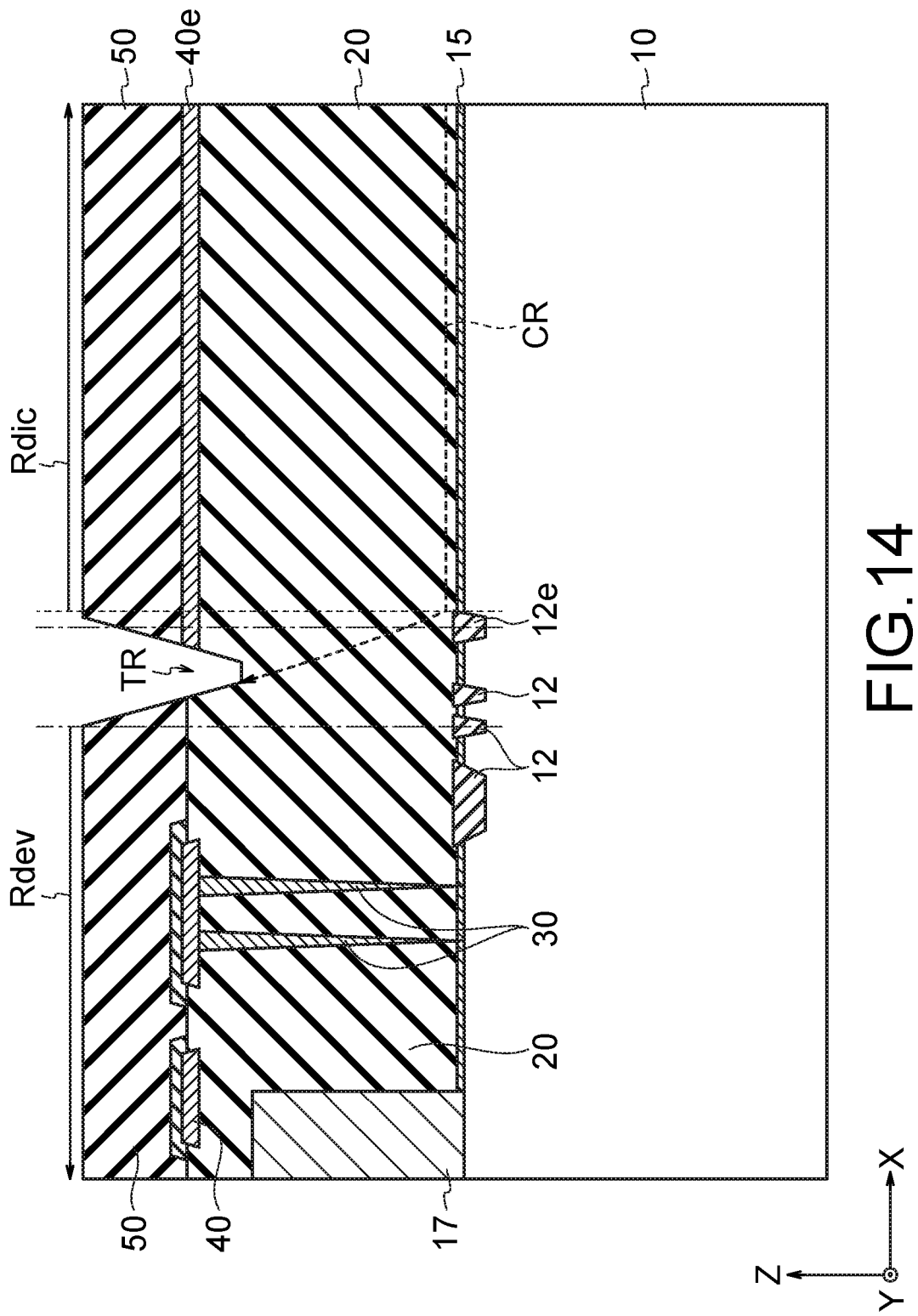
FIG. 14 is a sectional view showing a configuration example of a semiconductor device according to a second modification.

FIG. 14 is a sectional view showing a configuration example of a semiconductor device according to a second modification. According to the second modification, the first metal film 40e is provided entirely on the material film 20 in the dicing region Rdic and protects the material film 20 in the etching process to expose bonding pads. Therefore, the trench TR is formed as shown in FIG. 14 although the protruding portion 70 is not formed.

The passivation film 50 (for example, polyimide) is provided on the first metal film 40e. Accordingly, the trench TR may be formed by etching the material film 20 using the passivation film 50 as a mask in the etching process to expose bonding pads. Even when the passivation film 50 is removed by etching, the trench TR can, of course, be formed with no problem because the first metal film 40e functions as a mask. Furthermore, the trench TR can be formed by etching using a resist film (not shown) according to the lithography technology.

Even in this mode, the trench TR can induce the crack CR that is generated between the material film 20 and the metal compound layer 15 and terminate the propagation of the crack CR.

(Third Modification)

Figure 15:
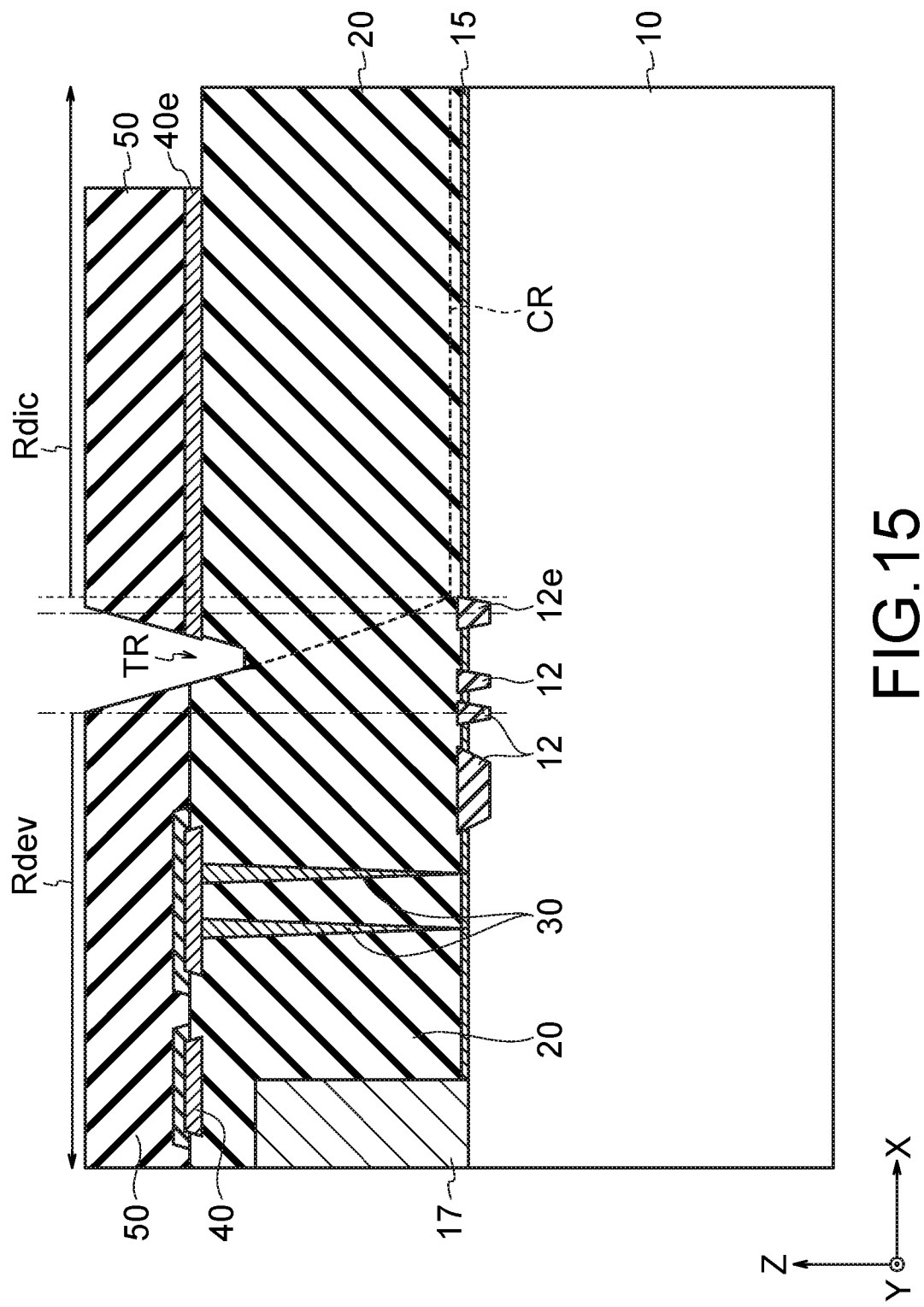
FIG. 15 is a sectional view showing a configuration example of a semiconductor device according to a third modification.

FIG. 15 is a sectional view showing a configuration example of a semiconductor device according to a third modification. The first metal film 40e and the passivation film 50 do not always need to be provided to the end of the dicing region Rdic (a chip end) and may be recessed from the chip end toward the device region Rdev to some extent.

(Fourth Modification)

Figure 16:
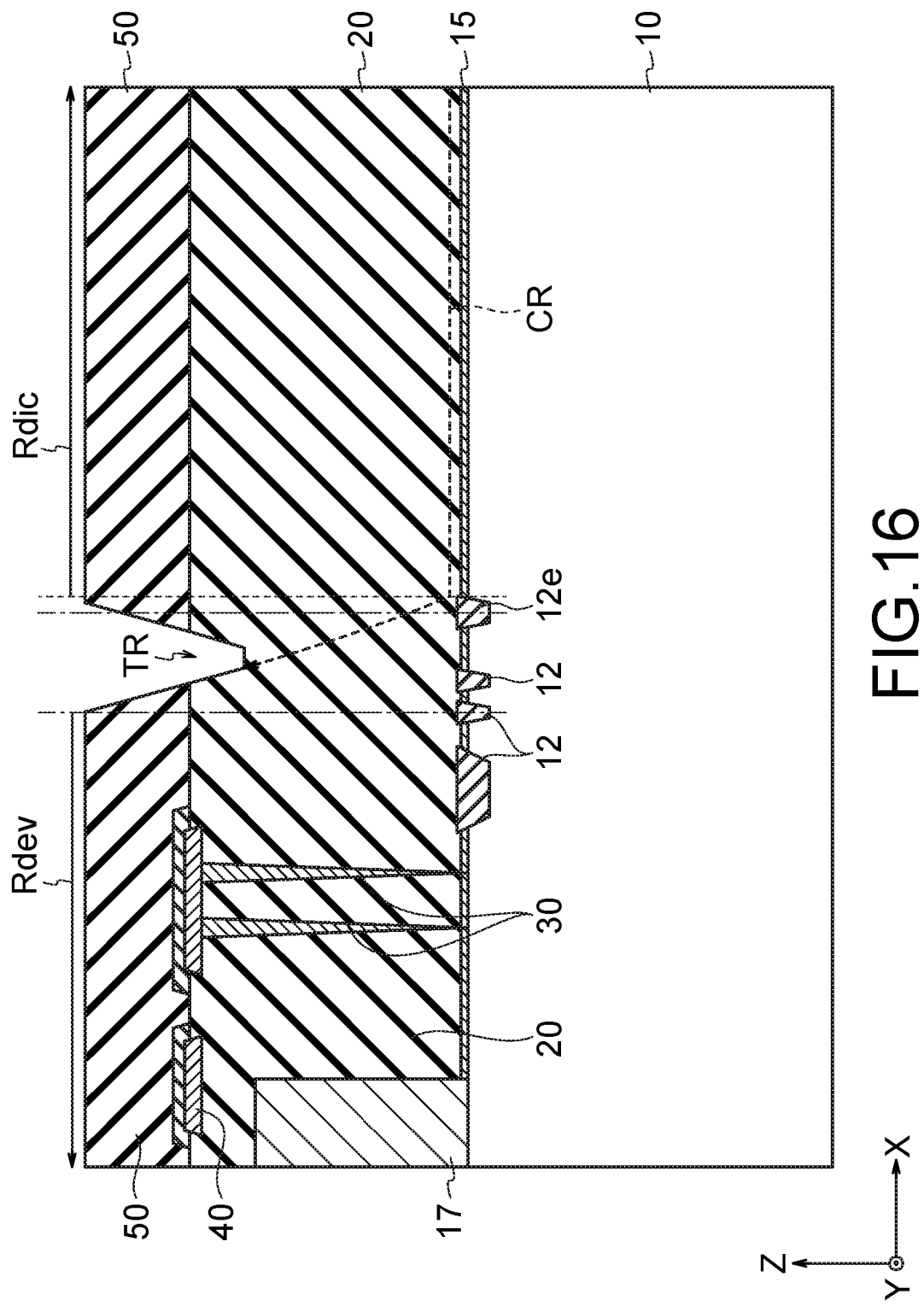
FIG. 16 is a sectional view showing a configuration example of a semiconductor device according to a fourth modification.

FIG. 16 is a sectional view showing a configuration example of a semiconductor device according to a fourth modification. In the fourth modification, the first metal film 40e is not provided and the passivation film 50 is provided on the material film 20 in the dicing region Rdic. The material film 20 is thus protected in the etching process to expose bonding pads. Therefore, the trench TR is formed in the same manner as the second modification. Accordingly, the trench TR can induce the crack CR that is generated between the material film 20 and the metal compound layer 15 and terminate the propagation of the crack CR also in the fourth modification.

As described above, according to the present embodiment, the trench TR is provided on the surface of the material film 20 between the device region Rdev and the dicing region Rdic, and provided nearer to the device region Rdev than the element isolation portions 12. Accordingly, the trench TR can induce the crack CR that is generated between the material film 20 and the metal compound layer 15, and terminate the propagation of the crack CR. In other words, the trench TR can restrict the propagation of the peeling-off of the material film 20 to the device region Rdev.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor device comprising:
a substrate;
a memory cell array including a stacked film of a plurality of silicon oxide films and a plurality of metal films alternately stacked;

a first film covering the memory cell array and having a trench;

a first conductive body provided in the first film and extending along a first direction which is a direction from the substrate to an upper surface of the first film; and a first resin filling the trench, wherein an upper surface of a first part of the first film is lower than an upper surface of a second part of the first film, the first part being a part of the first film closer to an edge of the substrate than the trench, and the second part being a part of the first film further away from the edge of the substrate than the trench.

2. The semiconductor device according to claim 1, further comprising:

a shallow trench isolation provided on the substrate and being closer to the edge of the substrate than the trench, in a view from the first direction.

3. The semiconductor device according to claim 1, further comprising:

a second conductive body provided in the first film, extending along the first direction, and adjacent to the first conductive body; and a first metal layer connecting between an upper edge of the first conductive body and an upper edge of the second conductive body.

4. The semiconductor device according to claim 3, wherein the first conductive body and the second conductive body include tungsten.

5. The semiconductor device according to claim 3, further comprising:

a second metal layer provided on at least a part of an upper surface of the first part of the first film.

6. The semiconductor device according to claim 5, wherein the first metal layer and the second metal layer include a same material.

7. The semiconductor device according to claim 1, wherein an upper portion of the second part of the first film includes a second resin.

8. The semiconductor device according to claim 7, wherein the second resin includes polyimide.

9. The semiconductor device according to claim 3, wherein the first metal layer is provided higher than the memory cell array.

10. The semiconductor device according to claim 2, further comprising:

a metal compound film provided on the substrate, wherein the shallow trench isolation isolates the metal compound film.

11. The semiconductor device according to claim 3, wherein the first metal layer is provided higher than a bottom of the trench.

12. The semiconductor device according to claim 11, wherein the bottom of the trench is provided higher than the memory cell array.

13. A semiconductor device comprising:

a substrate;

a memory cell array including a stacked film of a plurality of silicon oxide films and a plurality of metal films alternately stacked;

a first film covering the memory cell array and having a trench;

a first conductive body provided in the first film and extending along a first direction which is a direction from the substrate to an upper surface of the first film;

a second conductive body provided in the first film, extending along the first direction, and adjacent to the first conductive body;

a first metal layer connecting between an upper edge of the first conductive body and an upper edge of the second conductive body; and a first resin filling the trench.

14. The semiconductor device according to claim 13, wherein an upper surface of a first part of the first film is lower than an upper surface of a second part of the first film, the first part being a part of the first film closer to an edge of the substrate than the trench, and the second part being a part of the first film further away from the edge of the substrate than the trench.

15. The semiconductor device according to claim 13, wherein the first conductive body and the second conductive body include tungsten.

16. The semiconductor device according to claim 14, further comprising:

a second metal layer provided on at least a part of an upper surface of the first part of the first film, wherein the first part is a part of the first film closer to an edge of the substrate than the trench, and the second part is a part of the first film further away from the edge of the substrate than the trench.

17. The semiconductor device according to claim 13, wherein the first metal layer is provided higher than the memory cell array.

18. The semiconductor device according to claim 13, wherein the first metal layer is provided higher than a bottom of the trench.

19. The semiconductor device according to claim 18, wherein the bottom of the trench is provided higher than the memory cell array.

20. The semiconductor device according to claim 14, wherein an upper portion of the second part of the first film includes a second resin, wherein the first part is a part of the first film closer to an edge of the substrate than the trench, and the second part is a part of the first film further away from the edge of the substrate than the trench.

* * * * *